United States Patent [19]

Wu

[11] 4,389,731

[45] Jun. 21, 1983

[54] REMOTE CONTROL DEVICE FOR TOUCH TYPE TUNER OF TELEVISION

[76] Inventor: Ta-She Wu, No. 42, Feng-Chia St., Tainan, Taiwan

[21] Appl. No.: 254,849

[22] Filed: Apr. 17, 1981

[51] Int. Cl.³ .......................... H03J 9/00; H04B 1/06
[52] U.S. Cl. ................................. 455/153; 200/52 R; 200/81 H; 334/8; 358/194.1
[58] Field of Search ............... 455/151, 354, 152, 153, 455/352; 358/194.1; 334/8; 340/407, 825.03; 200/52 R, 81 H, 81.4, 81.5, 81.6

[56] References Cited

U.S. PATENT DOCUMENTS

| | | | |
|---|---|---|---|
| 2,019,316 | 10/1935 | Morey | 455/354 |
| 2,805,379 | 9/1957 | Troeller et al. | 455/151 |
| 2,838,629 | 6/1958 | Panzenhagen | 200/81 H |
| 3,080,720 | 3/1963 | Downs et al. | 200/81 H |

FOREIGN PATENT DOCUMENTS 2728989 1/1979 Fed. Rep. of Germany .......... 334/8

Primary Examiner—Marc E. Bookbinder

[57] ABSTRACT

A touch type tuner of television is equipped with a touch control mechanism which has a plurality of touch fingers, each thereof having one end abutting against touch buttons of the tuner respectively. The touch control mechanism is communicating with a remote control box by a plurality of flexible tubes connecting therebetween. As one of the push buttons of the remote control box is depressed, an air pressure is transmitted through the tube to blow a bellows which subsequently biases a movable body forwards and actuates a potential conducting line to contact with the other end of the corresponding touch finger, whereby the remote control of selection is achieved.

9 Claims, 8 Drawing Figures

REMOTE CONTROL DEVICE FOR TOUCH TYPE TUNER OF TELEVISION

BACKGROUND OF THE INVENTION

The present invention relates to a remote control device for a touch type tuner of a television, and more particularly to a pneumatic remote control device for a touch type tuner of a television.

Conventionally, the touch type tuner of a television is controlled remotely by installing a receiver in the main body of the television. The receiver receiving a command signal transmitted from a transmitter held by the viewer, accomplishes the operation of selection according to the command signal. Such kind of remote control device is indeed very convenient, except that the transmitter thereof is easy to damage by rough handling, and not universal to all types of remote controlled devices. In addition, the cost of the transmitter is rather high.

SUMMARY OF THE INVENTION

In accordance with the present invention, a remote control device for a touch type tuner of a television comprises:

a remote control box including means for air pressing which has a plurality of outlets;

a touch control mechanism including a plurality of bellow members, each being received in the respective cavity provided on the inner wall of the rearmost end of a housing, each said bellow member has its inlet communicating with said outlet of air pressing means through respective tube, the other end of each said bellow member biasing a respective movable body forwards as each said bellow member expands;

a plurality of conducting touch fingers, each having one end thereof abutting against the respective touch button of the tuner, and the other end thereof fixed insulatedly at the inner wall of the foremost end of the housing; and a potential conducting line which has a plurality of tongues at its ends, each said tongue resting on the free end of said respective movable body, thereby as the compressed air expands the bellow member, which subsequently biases the movable body to actuate the tongue to contact with the conducting touch finger to achieve the operation of selection.

It is an object of the present invention to provide a low cost pneumatic remote control device for touch type tuner of television.

It is another object of the present invention to provide a simply constructed pneumatic remote control device which is not easy to damage in case of rough handling.

It is a further object of the present invention to provide a pneumatic remote control device which is universal for application in all models of touch type tuner of television.

These and other objects will be apparent by describing a preferred embodiment with reference to the following drawings, in which:

DETAILED DESCRIPTION OF THE PREFERRED EMBODIMENT

Figure 1:
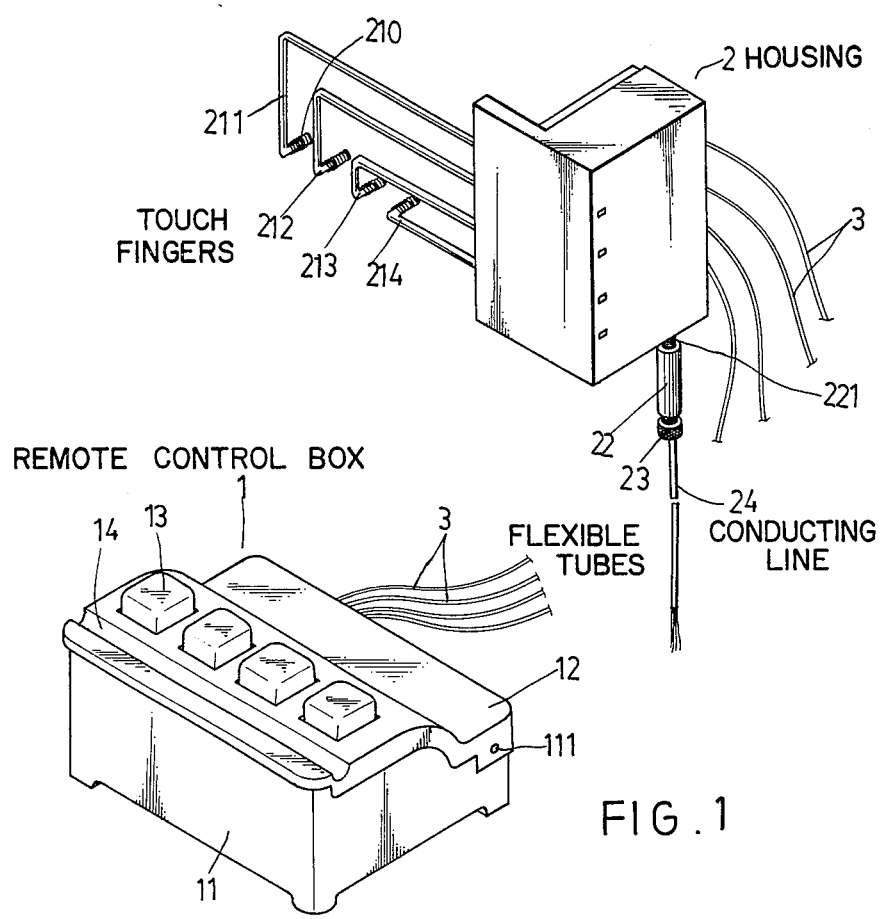
FIG. 1 is a perspective view of the preferred embodiment according to the present invention.
Figure 5:
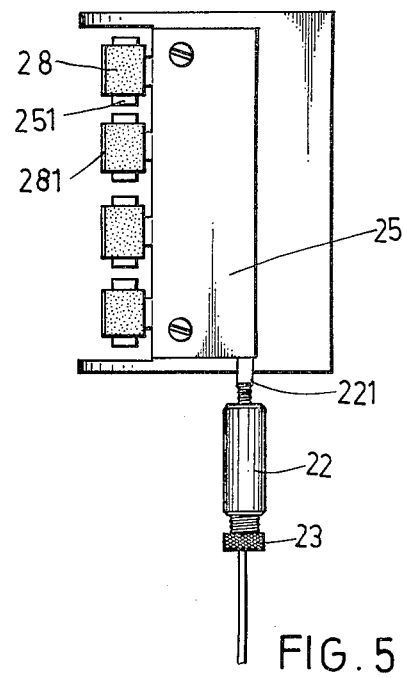
FIG. 5 is a side view of a touch control mechanism of the touch control mechanism of the embodiment.
Figure 6:
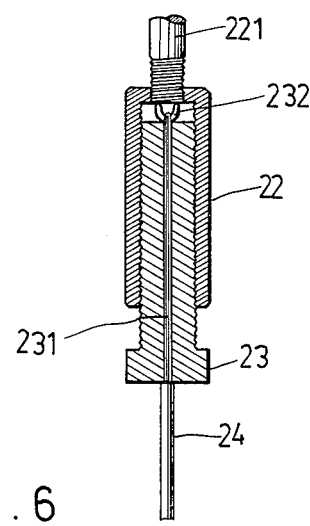
FIG. 6 is a sectional view of a joint portion of a potential conducting line.

As shown in FIG. 1, a remote control box 1 has a casing 11 with a top cover 12. The top cover 12 has one side thereof rotatably pivoted at a wall of the casing 11 with a pin 111. On the upper surface of the top cover are provided a groove 14 for laying a pen and four holes for protruding push buttons 13 provided. A housing 2 of a touch control member is L-shaped. Four touch fingers 211, 212, 213 and 214 of different lengths extend out of the casing. The bent end of each touch finger is mounted with a spring 210 for securing good touch between the touch button of the television and the touch finger. The bottom wall of the housing 2 is insulatedly mounted with a first screw 221 which has an end thereof passing through the bottom wall and being soldered at a metal board 25 as shown in FIG. 5. A inner-threaded sleeve 22 has one end screwed with the screw 221 and the other end screwed with a second screw 23. The second screw 23 has an axial through hole for passing through a potential conducting line 24. The potential conducting line 24 can be metal wire or water absorbing thread, such as cotton yarn etc., which is sheathed. When a cotton thread is used as potential conducting line, an end portion of the thread is folded and then passes through an axial through-hole 231 and hooked by a U-shaped metal hook 232 which is supported by the uppermost end of the second screw 23 as shown in FIG. 6. Through the hook 232 the cotton thread is connected to the first screw 221.

Figure 2:
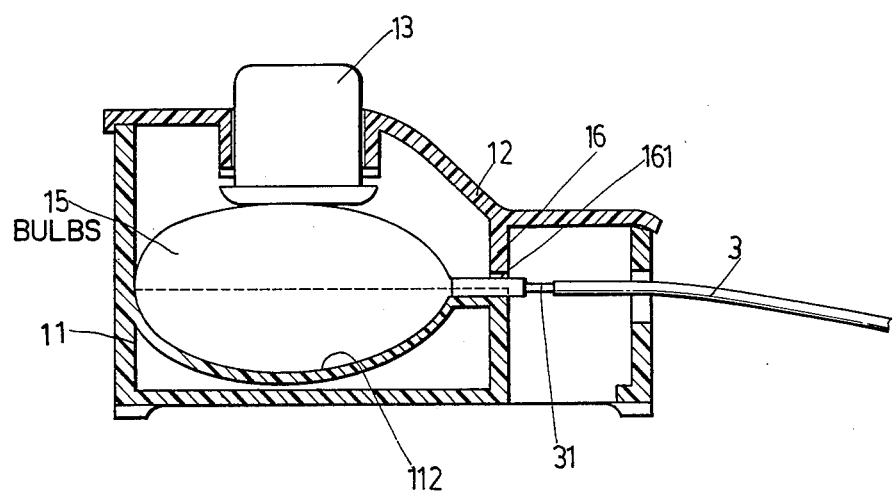
FIG. 2 is a sectional view of the remote control box of the preferred embodiment.
Figure 4:
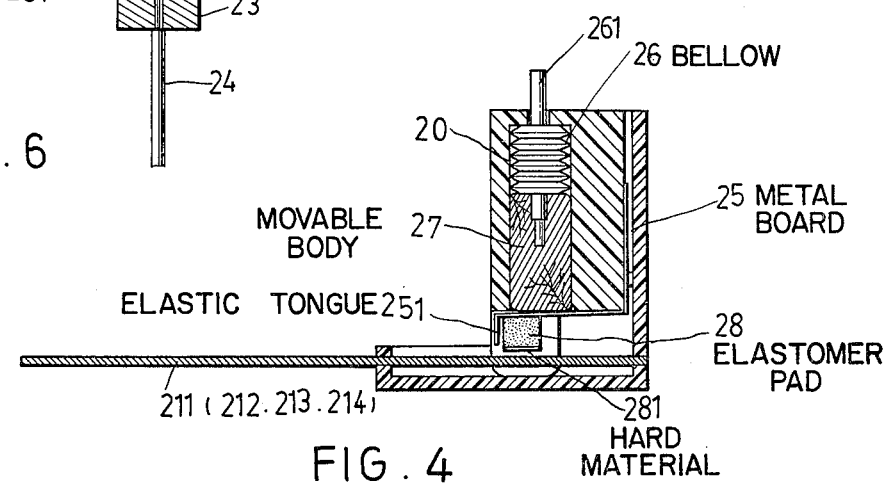
FIG. 4 is a sectional view of the touch control mechanism of the embodiment.

Four flexible tubes 3, each having one end communicating with an outlet of a rubber bulb 15 through a hard tube 31, and the other end communicating with the inlet 261 of a bellow 26 as shown in FIGS. 2 and 4.

Referring now to FIG. 2, four identical rubber bulbs 15 are received separately in four arc-shaped recesses 112 of the casing 11. The outlet of each bulb 15 is fixed by a stop wall 16 which has a hole 161 for inserting the outlet. On the upper surface of each rubber bulb 15 push button 13 rests, which has the upper portion thereof protruding out of the respective hole provided on the top cover 12 and the lower portion being allowed to move upward and downward only in a definite range.

Figure 3:
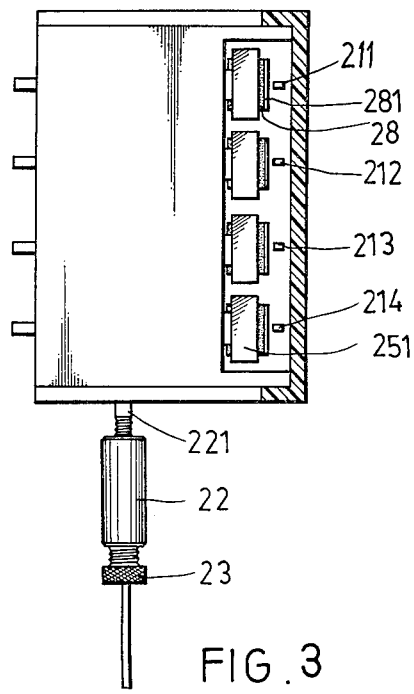
FIG. 3 is a side view in partial section of a touch control mechanism of the embodiment.
Figure 7:
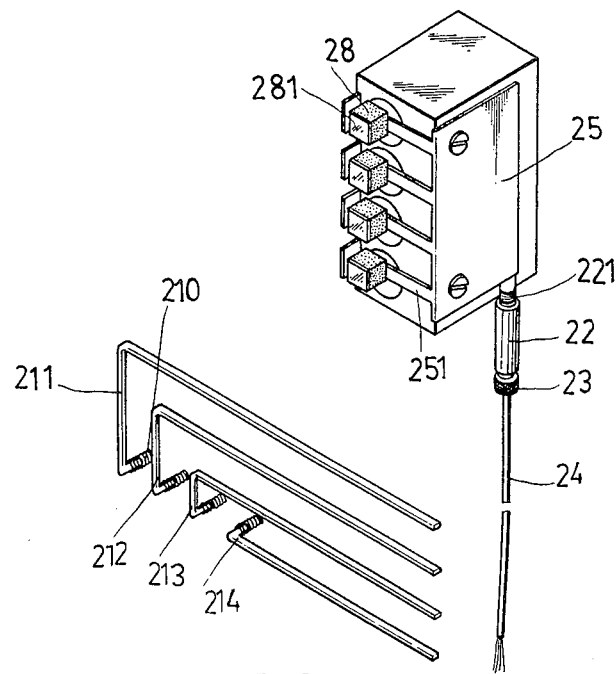
FIG. 7 is a schematic view of the embodiment illustrating the touch finger and a potential conductive line having four tongues at its end.

Referring to FIG. 4 four identical cavities 20 provided at the inner wall of the housing 2 separately receive four identical bellows 26. On the foremost end of each bellow biases a respective movable body 27 which subsequently abuts a respective elastic metal tongue 251, referring also to FIG. 7. Each metal tongue has its rightmost end integral with a metal board 25. To the front side of the metal tongue 251 is adhered a soft elastomer pad 28 such as sponge with a thickness larger than the length of free bent portion of the metal tongue 251. To prevent the soft elastomer 28 from unevenly sinking, a chip 281 of hard material is provided on the front side of the soft elastomer to enlarge the surface of pressing. The touch finger having an end thereof fixed at the foremost wall of the housing, is spaced from the free end of the tongue 251 when the bellows does not expand, as shown in FIG. 3.

Figure 8:
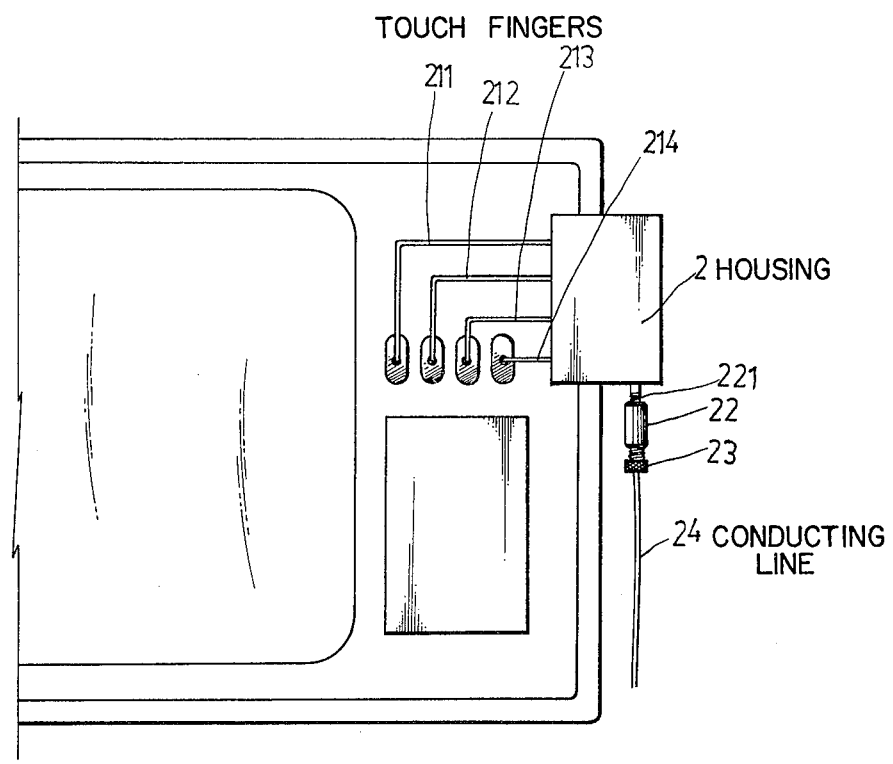
FIG. 8 is a schematic view illustrating a touch control mechanism of the embodiment mounting on a television.

As shown in FIG. 8, while the touch control mechanism 2 is mounted on the television, each touch finger 211, 212, 213 or 214 has its spring end abutting the respective touch buttons of the tuner. When the potential conducting line is made of water absorbing material, the free end thereof should be submerged in water. As the viewer depresses one of the push buttons 13, the air pressure will be transmitted from the rubber bulb through the tube to expand the corresponding bellow, which subsequently biases the movable body forward and actuates the free end of tongue to contact with the corresponding touch finger. The potential conducting line and the touch finger are thus closed and the operation of the selection is achieved.

With the invention thus explained, it is apparent that many modifications and variation may be made without departing from the spirit of the above embodiment, it is hence intended that the scope of the present invention be defined by the appended claims.

I claim:

1. A remote control device for a touch type tuner of a television comprising:
   a remote control box including a plurality of pressing means for selectively providing pressed air through individual ones of a respective plurality of outlets;
   a touch control mechanism including a plurality of bellow members, each being received in a respective cavity provided on the inner wall of the rearmost end of a housing, each said bellow member having an inlet at one end thereof communicating with one of said plurality of outlets through a respective tube, another end of each of said bellow members capable of biasing a respective movable body forwards when each said bellow member expands;
   a plurality of electrically conducting touch fingers, each conducting touch finger having one end thereof abutting against a respective touch button of the tuner, and the other end thereof fixed insulatedly at the inner wall of the foremost end of the housing; and
   a potential conducting line electrically coupled to a plurality of electrically conductive tongues, each said tongue mechanically contacting a free end of a respective one of said movable bodies such that as the pressed air expands a respective bellow member, its associated movable body is subsequently biased to cause its respective tongue to contact with a respective conducting touch finger to achieve a selection operation.

2. A remote control device for a touch type tuner of a television according to claim 1, wherein each of said plurality of pressing means includes an elastomeric plurality received in a corresponding recess provided in the remote control box, and push button for applying pressure on said elastomeric bulb to press air through the corresponding outlet of said pressing means.

3. A remote control device for a touch type tuner of a television according to claim 1 or 2, wherein said tongues each have a free end bent, and an unbent portion thereof including a soft elastomer pad, the thickness of said soft elastomer pad being slightly larger than the length of the bent portion.

4. A remote control device for a touch type tuner of a television according to claim 3, further comprising a chip of hard material contacting the foremost surface of the soft elastomer pad for securing even a depression, of said elastomer pad as the respective tongue is actuated to contact its respective touch finger.

5. A remote control device for a touch type tuner of a television according to claim 1 or 2, further comprising a spring coupled to the end of each of said conducting touch fingers abutting said respective touch buttons for securing good touch between said touch fingers and the touch buttons.

6. A remote control device for a touch type tuner or a television according to claim 1 or 2, wherein said potential conducting line is a water absorbing thread with one end thereof soaking in water.

7. A remote control device for a touch type tuner of a television according to claim 1 or 2, wherein said potential conducting line is a metal wire.

8. A remote control device for a touch type tuner of a television according to claim 1 or 2, wherein said remote control box is provided with a groove on an upper cover thereof for receiving a pen.

9. A remote control device for a touch type tuner of a television according to claim 1 or 2, wherein a metallic, conductive coupler integral with said tongues couples said potential conducting line to said tongues.

* * * * *